(12) United States Patent
Van Roosmalen

(10) Patent No.: US 8,796,534 B2
(45) Date of Patent: Aug. 5, 2014

(54) SOLAR CELL AND ASSEMBLY OF A PLURALITY OF SOLAR CELLS

(75) Inventor: Johannes Adrianus Maria Van Roosmalen, Petten (NL)

(73) Assignee: Stichting Energieonderzoek Centrum Nederland (NL)

( * ) Notice: Subject to any disclaimer, the term of this patent is extended or adjusted under 35 U.S.C. 154(b) by 223 days.

(21) Appl. No.: 13/496,145

(22) PCT Filed: Sep. 14, 2010

(86) PCT No.: PCT/NL2010/050584
§ 371 (c)(1),
(2), (4) Date: May 30, 2012

(87) PCT Pub. No.: WO2011/031156
PCT Pub. Date: Mar. 17, 2011

(65) Prior Publication Data
US 2012/0273022 A1      Nov. 1, 2012

(30) Foreign Application Priority Data

Sep. 14, 2009 (NL) .................................. 2003482

(51) Int. Cl.
*H02N 6/00* (2006.01)
*H01L 31/042* (2014.01)
*H01L 31/00* (2006.01)
*H01L 31/0224* (2006.01)
*H01L 31/05* (2014.01)
*H01L 27/142* (2014.01)

(52) U.S. Cl.
CPC ... H01L 31/02245 (2013.01); H01L 31/022433 (2013.01); H01L 31/0516 (2013.01); H01L 27/1428 (2013.01)
USPC .......................................... 136/244; 136/256

(58) Field of Classification Search
CPC ................. H01L 31/02245; H01L 31/022433; H01L 31/0516; H01L 31/022441; H01L 31/022458; H01L 27/1428
USPC ................................................... 136/244, 256
See application file for complete search history.

(56) References Cited

U.S. PATENT DOCUMENTS

| 6,573,445 B1 * | 6/2003 | Burgers ......................... 136/256 |
| 2008/0276982 A1* | 11/2008 | Jordan et al. .................. 136/246 |
| 2009/0050190 A1* | 2/2009 | Nishida et al. ................ 136/244 |

FOREIGN PATENT DOCUMENTS

| DE | 198 54 269 | 6/2000 |
| DE | 10 2005 053363 | 5/2007 |

(Continued)

OTHER PUBLICATIONS

Romijn et al., 23rd European Photovoltaic Solar Energy Conference, Valencia, Spain Sep. 1-5, 2008.*

(Continued)

*Primary Examiner* — Eli Mekhlin
(74) *Attorney, Agent, or Firm* — Meyer IP Law Group

(57) ABSTRACT

The invention relates to a solar cell (1), comprising a front side (10) and rear side (20). In use, the front side (10) is turned towards the light, on account of which charge carriers accumulate on the front side (10) and charge carriers of an opposite type accumulate on the rear side (20). The front side (10) is provided with a first pattern (13) of conductive elements (51, 52) which are connected to first contact points (15) on the rear side (20) by means of a number of vias (14) in the solar cell. The rear side (20) is provided with a second pattern of conductive elements (22) which are connected to second contact points (21) on the rear side (20). The first and second contact points (15, 21) are situated along a number of lines (30). The first contact points (15) are situated on a first side of the lines (30) and the second contact points (21) are situated on a second side of the lines (30).

17 Claims, 5 Drawing Sheets

(56) References Cited

FOREIGN PATENT DOCUMENTS

| | | |
|---|---|---|
| DE | 10 2007 013553 | 9/2008 |
| EP | 2 028 696 | 2/2009 |
| EP | 2 081 237 | 7/2009 |

OTHER PUBLICATIONS

Romijn, I.G. et al., "An overview of MWT cells and evolution to the ASPIRE concept: a new integrated mc-Si cell and module design for high-efficiencies," 23rd European Photovoltaic Solar Energy Conference, Valencia, Spain, Sep. 1, 2008, pp. 1000-1005.

* cited by examiner

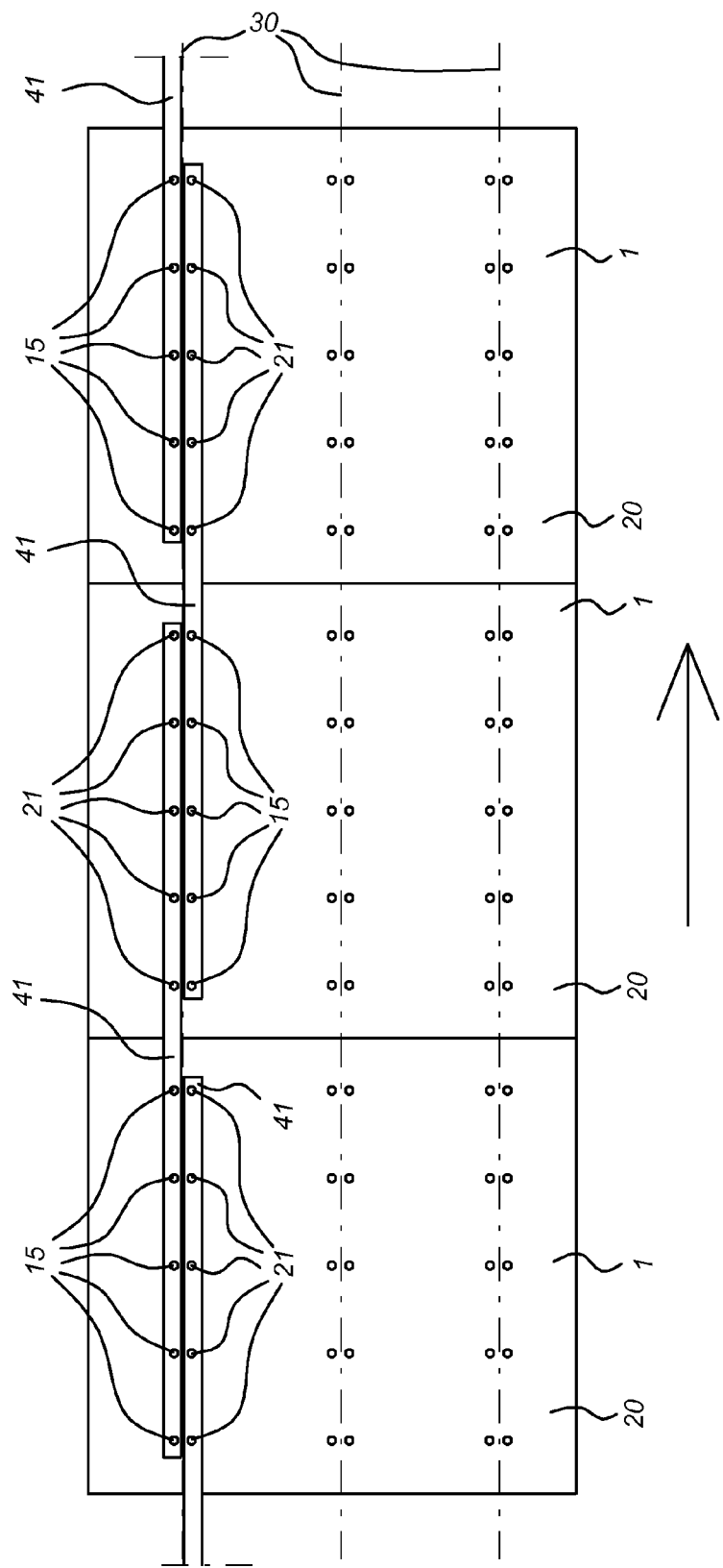

SOLAR CELL AND ASSEMBLY OF A PLURALITY OF SOLAR CELLS

FIELD OF THE INVENTION

The present invention relates to a solar cell, comprising a front side and a rear side, in which, in use, the front side is turned towards the light, on account of which charge carriers accumulate on the front side and charge carriers of an opposite type accumulate on the rear side and in which the front side is provided with a first pattern of conductive elements which are connected to first contact points on the rear side by means of a number of vias in the solar cell and in which the rear side is provided with a second pattern of conductive elements which are connected to second contact points on the rear side.

PRIOR ART

Solar cells of this type are known from the prior art. Solar cells are often panel-shaped and have a front side and a rear side. During use, the front side is turned towards incident (sun)light. The front side is therefore also designed to collect sunlight and to reflect as little of it as possible.

Solar cells may comprise a panel of semiconductor material, for example crystalline silicon, in which a p-type and an n-type layer have been formed. The panel of crystalline silicon is situated between the front side and the rear side. Such silicon solar cells are self-supporting and typically have a thickness of 100-350 µm.

The core of the solar cell is formed by a transition layer between the p-type and the n-type semiconductor layer. On account of incident photons, charge carriers are formed in the p-type and n-type material, due to the fact that electrons are taken to a higher conduction band. As a result thereof, free electrons and holes are formed. Near the transition layer, the free electrons and the holes may be separated from one another instead of being reunited. The electrons will be drawn to the n-type material, while the holes will be drawn to the p-type material. In this way, on account of incident light, charges of opposite types will accumulate on the front side and the rear side of the solar cell.

In order to accumulate the charge on the front side and the rear side, a pattern of conductors may be arranged on the front and rear side in order to conduct the charge by interaction of the silicon material with incident (sun)light. The pattern may be made from a suitable conductive material, for example a suitable type of metal.

The pattern may be designed in any possible way.

The pattern on the front side may be designed such that an optimum balance is achieved between producing a pattern across the surface of the front side which is as dense as possible and said pattern causing as little of a shadow effect as possible. The pattern may, for example, comprise one or more main conductors which connect the other conductors in the pattern to one another and which collect the generated electrical charge from the other conductors. An example of a possible pattern is described in "The Starfire project: towards in-line mass production of thin high-efficiency back-contacted multicrystalline silicon solar cells", written by M. N. van den Donker, 23rd European Photovoltaic Solar Energy Conference, 1-5 Sep. 2008, Valencia, Spain.

The pattern on the rear side may be formed in any possible way. The pattern on the rear side may, for example, consist of a layer which covers virtually the entire rear side, since the shadow effect of the pattern does not have to be taken into account on the rear side.

In the prior art, a solar panel is composed of a number of silicon solar cells. Within the solar panel, the solar cells are connected to one another in series to form a string. By means of a tab, the pattern on the front side of one solar cell is connected to the pattern on the rear side of a solar cell which is arranged next to it. In this way, it is possible to connect the solar cells in a solar panel in series.

The tabs may be in the form of conductive tracks, for example made of aluminium or copper. The tabs can be in the form of flattened wires. The tabs may have a width of, for example, 1.5-2.5 mm and a thickness of 80-170 µm or 100-150 µm. The size of the tabs which run on the front side 10 of a solar cell in particular has to be limited in order to produce as little of a shadow effect as possible.

The pattern on the front side and on the rear side may comprise certain contact points which can be brought into contact with the tabs.

In order to simplify connecting the solar cells in series, the pattern of conductive elements on the front side can be connected to the rear side of the solar cell via a number of vias in the solar cell. The contact points of the front side are then placed on the rear side. Thus, a number of first contact points are formed on the rear side which are conductively connected to the front side. On the rear side, a number of second contact points may be formed which are conductively connected to the rear side.

Such solar cells with vias are also referred to as metal wrap-through solar cells. With these solar cells, both contact points are thus located on the rear side.

Connecting such a solar cell, the connection points of both the front side and the rear side of which are situated on the rear side of the solar cell, using tabs as described above is relatively difficult, because the first and second contact points are mixed, which requires a relatively complex pattern of tabs. In this context, it should be noted that direct electrical contact between the tabs for the first contact points and the tabs for the second contact points has to be avoided.

Therefore, the prior art offers a solution in which the tabs are replaced by a film which is arranged on the rear side of the solar cell and comprises a pattern of metal connections. These tracks can be applied to the film in a desired pattern by means of chemical processes. In this way, a relatively intricate pattern of tracks can be applied accurately.

The conductive tracks in the film are used to connect the solar cells in series.

It is an object of the present invention to provide an alternative solar cell which simplifies the use of tabs.

BRIEF DESCRIPTION

According to one aspect, a solar cell is provided, comprising a front side and a rear side, in which, in use, the front side is turned towards the light, on account of which charge carriers accumulate on the front side and charge carriers of an opposite type accumulate on the rear side, in which the front side is provided with a first pattern of conductive elements which are connected to first contact points on the rear side by means of a number of vias in the solar cell, in which the rear side is provided with a second pattern of conductive elements which are connected to second contact points on the rear side, in which the first and second contact points are situated along a number of contact lines, in which the contact lines extend substantially in a first direction along the surface of the rear side, in which the first contact points are situated on a first side of the contact lines and the second contact points are situated on a second side of the contact lines.

According to a further aspect, an assembly of such solar cells is provided, in which at least two solar cells are arranged next to one another in the first direction, in such a manner that the contact lines substantially adjoin one another, in which the solar cells are positioned in an alternating fashion, so that the first contact points of a first solar cell are in line with the second contact points of an adjacent solar cell.

The term contact lines as used above does not refer to physical lines or structures which can be contacted or along which electrical conduction can take place. The term contact lines 30 is used in this context to denote imaginary lines along which or next to which the first and second contact points 15, 21 are positioned. Therefore, it is also possible to use the terms lines, imaginary lines, contact point lines or imaginary contact point lines instead of the term contact lines.

Solar cells of this type make it possible to produce an assembly of solar cells in a simple and inexpensive manner.

Further embodiments are described in the dependent claims.

BRIEF DESCRIPTION OF THE DRAWINGS

The invention will be described in more detail below with reference to a number of drawings which show a few exemplary embodiments. The drawings are only intended for illustrative purposes and do not limit the scope of protection which is defined by the claims.

DETAILED DESCRIPTION

Figure 1A:
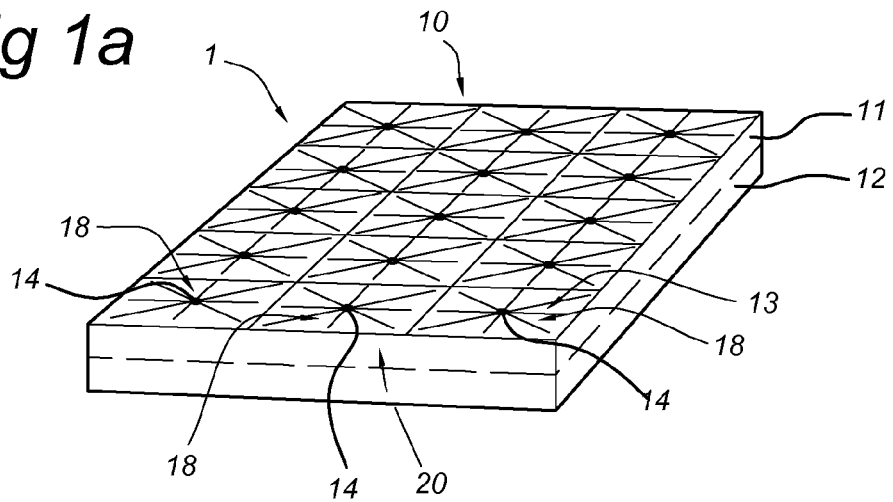
FIGS. 1a-c diagrammatically show a solar cell according to an embodiment.

FIG. 1a diagrammatically shows a solar cell 1 comprising a front side 10 and a rear side 20. The front side 10 is suitable for collecting (sun)light. Between the front side 10 and rear side 20, there is a semiconductor layer consisting of a base layer 12 which may, for example, be of the p-type. On the upper side of the base layer 12, an emitter layer 11 of an opposite type may be formed by means of a diffusion-based process, in this example therefore an n-type emitter layer 11, or by means of any other suitable process. According to an alternative, the base layer 12 may be of the n-type and the emitter layer 11 may be of the p-type.

On account of incident (sun)light, charge carriers with opposite charges will accumulate on the front side 10 and the rear side 20.

In order to dissipate this accumulated charge from the emitter layer 11, the front side 10 is provided with a first pattern 13 of conductive elements. This pattern 13 may be any desired pattern, as will be discussed below in more detail. FIG. 1a shows a possible first pattern 13 in diagrammatic form.

The first pattern 13 is passed to the rear side 20 via a number of vias 14 through the solar cell 10. For this reason, a conductive element 17 may be provided in the via 14, such as a metal (see FIG. 1c which will be discussed below).

The via 14 may be formed as a via which is substantially perpendicular to the surface of the front side 10.

Figure 1B:
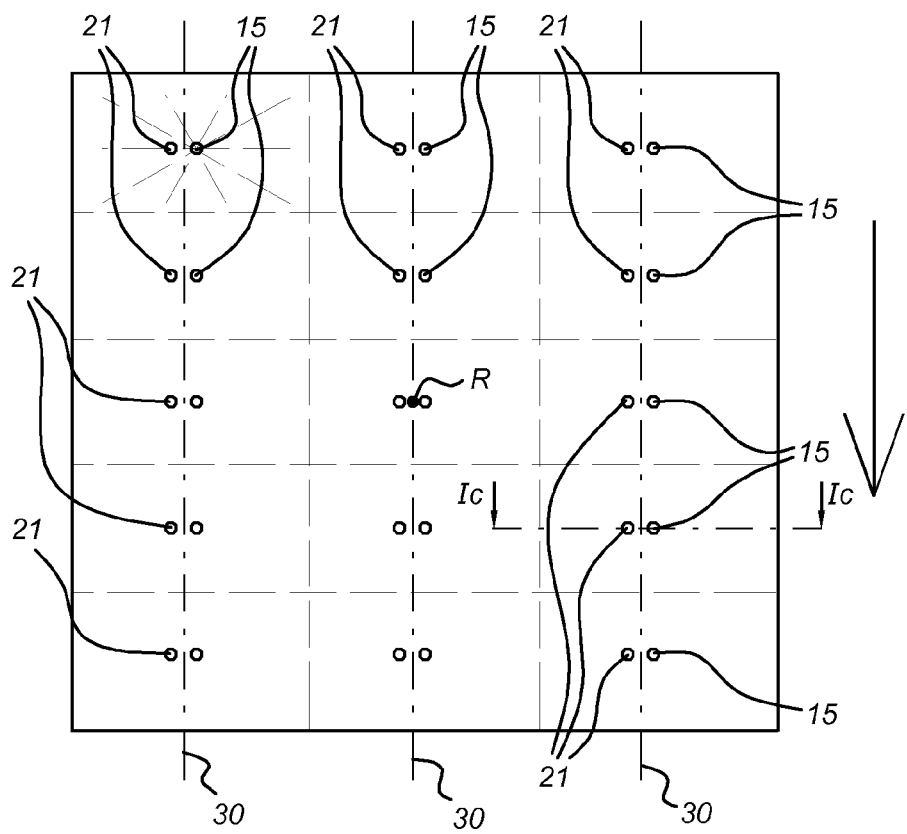

The rear side 20 is diagrammatically illustrated in FIG. 1b. The rear side 20 is provided with a second pattern of conductive elements 22 which are connected to second contact points 21 on the rear side. In the illustrated example, the second pattern of conductive elements 22 consists of a conductive layer which covers the entire rear side 20, as the shadow effect of the pattern does not have to be taken into account on the rear side 20. However, just like the front side, the rear side 20 may also comprise a pattern of conductive elements for reasons other than loss of shadow, for example because of optimization of the rear side passivation and reflection. In this context, reference is also made, by way of example, to the abovementioned article "The Starfire project: towards in-line mass production of thin high-efficiency back-contacted multicrystalline silicon solar cells", written by M. N. van den Donker.

FIG. 1b furthermore shows that the vias 14 end on the rear side 20, with the vias ending in first contact points 15. This is shown in more detail in FIG. 1c, which illustrates a cross section of a part of the solar cell 1 (see indication Ic in FIG. 1b).

Figure 1C:
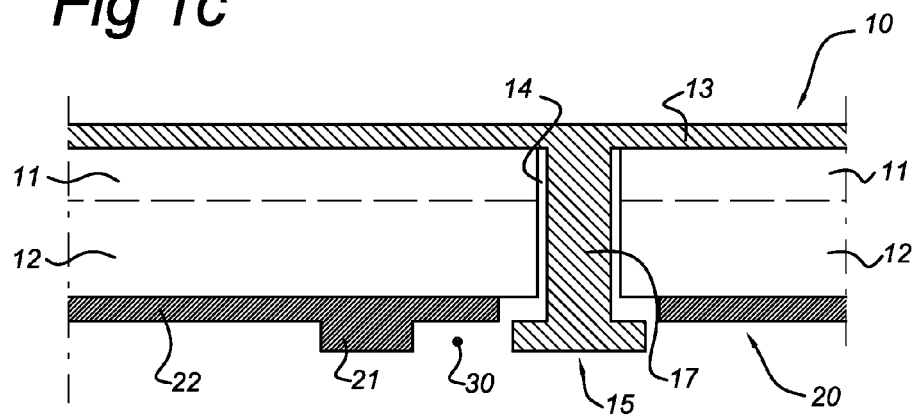

FIG. 1c shows a via 14 comprising conductive element 17 which connects the first pattern 13 on the front side 10 to a first contact point 15 on the rear side 20 of the solar cell 1. Furthermore, insulation (not shown) may be provided in order to electrically insulate the first contact point 15 and the conductive element 17 from the base layer 12. This is illustrated diagrammatically by showing the first contact point 15 and the conductive element 17 in a floating position. However, it will be understood that many types of insulation can be used, in which there is, for example, mechanical contact, but no electrically conductive contact.

It should be noted here, that FIG. 1c only shows a diagrammatic overview of a via 14 and that many variations are possible for forming a via, as will be understood by someone skilled in the art. The via may, for example, be filled completely with conductive element 17 or only a conductive element (e.g. metal) may be arranged along the wall of the via 14. Furthermore, it is possible to provide additional layers, such as an anti-reflective coating (ARC) on the front side 10 in order to reduce the reflection of incident (sun)light.

As can be seen in FIG. 1b, the first and second contact points 15, 21 are situated along a number of contact lines 30, with the contact lines 30 extending substantially in a first direction along the surface of the rear side 20. The first direction is illustrated in the figures by means of a dashed arrow in each case.

FIG. 1b shows that the first contact points 15 are in each case on a first side of the contact lines 30 (on the right-hand side in FIG. 1b) and the second contact points 21 are in each case situated on a second side of the contact lines 30 (on the left-hand side in FIG. 1b).

The distance between the first contact points 15 and the contact line 30 is substantially equal to the distance between the second contact points 21 and the contact line 30. In other words, the first contact points 15 and second contact points 21 are situated at an equal distance from the contact line 30 but in each case at opposite sides thereof.

In this case, it should be noted that FIG. 1b is only an example and that variations are possible. Thus, the first contact points can be positioned to the left or right of the contact lines 30. The orientation of the first contact points with respect to the contact line 30 can also be chosen to be different for each contact line.

Furthermore, the number of first contact points 15 per contact line 30 can also differ from the number of second contact points 21 per contact line 30. It is possible that, for example, twice as many second contact points 21 per contact line 30 are formed than first contact points 15.

Such configuration makes it possible to connect the first contact points 15 and the second contact points 21 to one another in a simple manner by means of straight tabs (not shown in FIGS. 1a-c) in order to collect the charge from these contact points 15, 21.

By positioning the first contact points 15 offset with respect to the contact lines 30 and positioning the second contact points 21 offset in the opposite direction with respect to the contact lines 30, straight tabs can be used to connect the first contact points 15 to one another and other straight tabs can be used to connect the second contact points 21 to one another. This configuration also permits simple series connections between solar cells, as will be explained below in more detail.

The distance between the first and second contact points 15, 21 to the closest contact line 30 may be smaller by a factor of at least 5 or 10 than the distance between the contact lines 30. This condition applies to solar cells 1 having two or more contact lines 30.

The distance between the first and second contact points 15, 21 to the closest contact line in 30 may be in the order of magnitude of 0-6 mm or at least in the order of magnitude of 1-5 mm. The distance can in this case be measured with respect to the centre of the first and second contact points 15, 21, measured in a direction which is substantially perpendicular to the first direction.

The contact lines 30 are rotationally symmetrical for a rotation of 180° about an axis of rotation R which is substantially perpendicular to the surface of the rear side 20 of the solar cell 1. The axis of rotation R passes through the centre of the solar cell 1, as is illustrated in FIG. 1b.

It will be clear that when the solar cell is rotated +/−180° with respect to the axis of rotation R which is substantially at right angles to the rear side 20 of the solar cell 1, the contact lines 30 come to lie in the same location, but the first and second contact points 15, 21 change places, or at least come to lie on the other side of the contact line 30. This makes it readily possible to connect different solar cells 1 in the first direction.

This is due to the fact that when two solar cells 1 are placed one next to or behind the other in the first direction, with the first solar cell being rotated 180° with respect to the second solar cell 1, the contact lines 30 of the first and second solar cell 1 are aligned with respect to one another.

This is shown diagrammatically in FIG. 4. FIG. 4 shows an assembly of solar cells 1, which will be discussed below in more detail.

As is illustrated in FIG. 1a, the first pattern of conductive elements 13 on the front side 20 may be divided into a number of unit cells 18 placed in a matrix structure, with each unit cell 18 comprising a subpattern of conductive elements, in which each subpattern is connected to the first contact points 15 on the rear side 20 by means of a via 14 in the solar cell 1.

It will be clear that the matrix structure comprises a number of rows of unit cells 18 extending in the first direction, which number corresponds to the number of contact lines 30. The number of unit cells 18 in turn can correspond to the number of vias 14 and to the number of first contact points 15.

The matrix structure can, for example, be a 3×5 matrix structure, as illustrated in FIG. 1a, but can also be any other suitable matrix structure, such as for example 1×1, 2×2, 3×6, 4×4, 5×3, 3×60 etc.

Below, a number of embodiments will be discussed by means of which the effect described here can be achieved.

Asymmetrical Subpatterns

The vias 14 can be positioned offset with respect to the centre of the unit cell 18. The offset positioning ensures that the contact points 15 come to lie offset with respect to the contact lines 30. The vias 14 and the first contact points 15 can be placed on in each case the same side of the contact line 30. In this embodiment, the unit cells 18 can all have the same dimensions, or at least the same dimension in a direction perpendicular to the first direction, which is the direction which coincides with the direction of the contact lines 30.

This therefore means that the vias 14 are not positioned in the centre of the unit cell 18, but at a position which is asymmetrical with respect to the centre.

Likewise, the second contact points 21 may be positioned offset with respect to the centre of the unit cell 18, or more generally offset with respect to the contact lines 30. It should be noted in this case that the positioning of the second contact points 21 along the contact lines 30 does not have to correspond to the matrix structure of the unit cells 18 on the front side 20.

When choosing the subpatterns, it is possible to take into account the fact that the subpatterns on the one hand have to have a degree of coverage which is as dense as possible in order to be able to dissipate accumulated charge carriers as efficiently as possible, but that on the other hand the conductive elements have to form a surface which is as small as possible in order to reflect as little incident light as possible.

FIG. 1a shows a possible subpattern which takes these conflicting requirements into account. The pattern 13 shown in FIG. 1a consists of subpatterns which in each case branch from a central point which coincides with a via 14 across the surface of a unit cell 18. However, it will be clear that other patterns and subpatterns can be used. Instead of the illustrated subpatterns, a subpattern can also be formed by a cruciform subpattern comprising two elements which are substantially perpendicular to one another, as will be discussed below in more detail.

In FIG. 1a, the central points of the subpatterns coincide with the offset vias 14. However, it is also possible to place the central points in a non-offset position, that is to say in the centre of the unit cells 18 and to only place the vias 14 in an offset position. In that case, an electrical connection may be formed between the central point and the offset via 14, an example of which is shown below with reference to FIG. 2c.

The various subpatterns in the various unit cells 18 may be formed as electrically separate subpatterns, which results in a saving in the number of conductive elements which constitute the pattern and leads to less reflective surface on the front side 10. Alternatively, the subpatterns in the various unit cells 18 can be electrically connected to one another. This has the advantage that when one of the conductive elements has a defect, the charge carriers can travel to a via 14 via another route. Obviously, in the latter case, the subpattern of unit cells on the edge of the solar cell and on the corners of the solar cell will deviate from the subpattern of unit cells in the centre of the solar cell, that is to say unit cells which are surrounded on all sides by other unit cells. In a 3×5 matrix structure, nine different subpatterns can therefore be present (4 corner types, 4 edge types and 1 centre type).

It should be noted here, that placing vias 14 in a position which does not coincide with the centre of a unit cell 18 is not an obvious measure. This is due to the fact that it is obvious to chose a symmetrical pattern in order to dissipate charge carriers from the front side 10 of the solar cell 1 as efficiently as possible, in order both to minimize the surface of the conductive parts of the pattern 13 and to keep the distance which charge carriers have to travel through the conductive parts to a minimum.

When vias 14 are placed in a position which does not coincide with the centre of a unit cell 18, the result is that the subpattern is no longer symmetrical with respect to the centre of the unit cell 18, which may lead to an unevenly distributed current output across the surface of the unit cell 18.

Figure 2A:
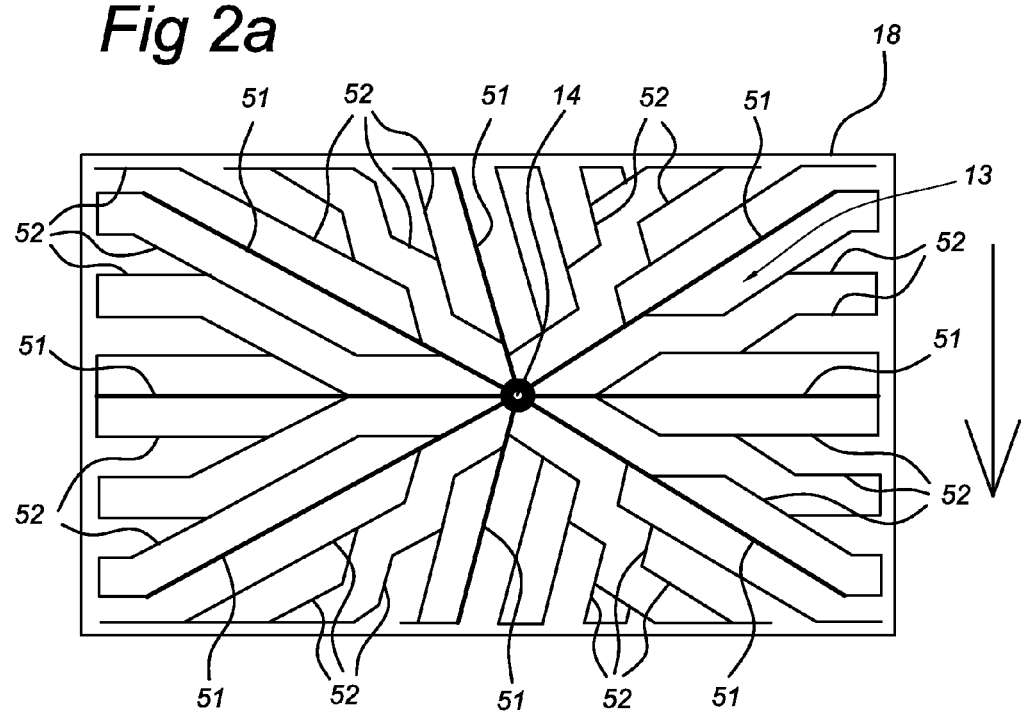
FIGS. 2a-2d diagrammatically show a solar cell according to various embodiments, FIG. 3 diagrammatically shows a solar cell according to an alternative embodiment, and FIG. 4 diagrammatically shows an assembly of a number of embodiments.
Figure 2B:
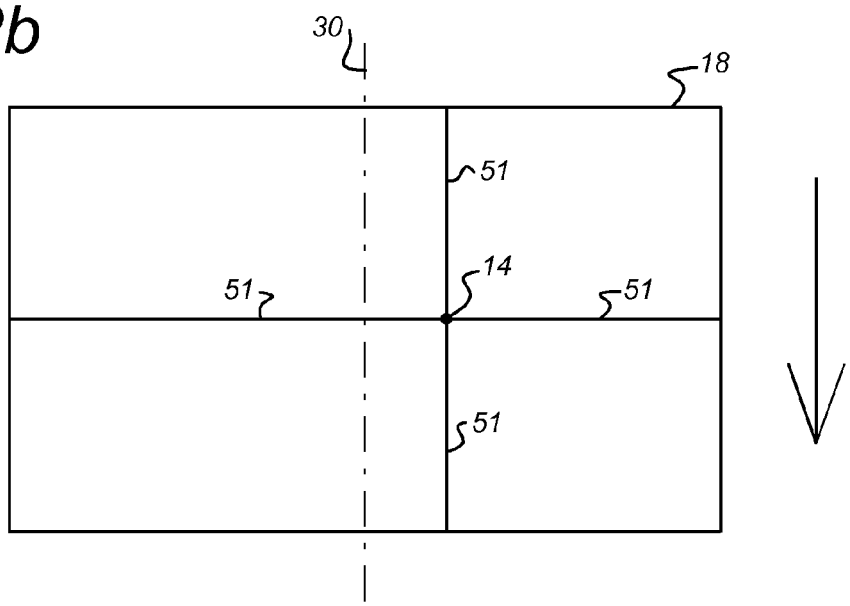

This can be overcome by using a special subpattern, an example of which is shown in more detail in FIG. 2a and in FIG. 2b.

FIG. 2a shows a subpattern which is situated around a via 14. The subpattern consists of a number of main elements 51 which extend in different directions across the surface of the unit cell 18 from a central point which coincides with the via 14, thus forming a star-shaped pattern. Examples thereof are shown in FIGS. 2a and 2b.

Since via 14 is no longer situated in the centre of the unit cell 18 (the centre can be defined as the point of intersection between a line dividing the unit cell 18 in two halves lengthwise and a line dividing the unit cell 18 in two halves widthwise), the configuration of the main elements 51 can be adapted thereto.

In one embodiment, the subpattern comprises an even number of main elements 51, which can be divided in pairs, a pair consisting of main elements 51 extending in opposite directions from the via 14.

The subpattern may, for example, comprise at least one pair of main elements 51 which extend in opposite directions from the central point and which make an angle of 2°-10° with respect to one another. The subpattern may also comprise a pair of main elements 51 which extend in opposite directions from the central point and which make an angle of 2°-5° with respect to a line perpendicular to the first direction. This results in an asymmetrical subpattern of main elements 51, the asymmetry consisting in the fact that the subpattern of the main elements 51 is only rotationally symmetrical for a rotation of 360° about the central point. Such a pattern is shown diagrammatically in FIG. 2a.

This method divides the unit cell 18 into approximately equal parts (pie wedges) by the main elements 51, from which the current is collected. The main elements 51 are connected to a number of conductive subelements 52 which are efficiently distributed over the parts formed by the main elements. The main elements 51 and the conductive subelements 52 may be composed of straight parts or curved parts or a combination of straight and curved parts.

More generally, it can be noted that the subpattern comprises a number of main elements 51 which extend from the central point, in which two adjacent main elements 51 are at an angle with respect to one another, in which the angles between adjacent main elements 51 are not all equal to one another. The main elements 51 thus form an irregular star-shaped pattern.

The central points can in this case coincide with the vias. The irregular star-shaped pattern may only be rotationally symmetrical for a rotation of 360° about the central point, as has already been indicated above.

It will be clear that FIG. 2a only shows an example of a subpattern and that many possible variants are conceivable. One variant is shown, for example, in FIG. 2b. FIG. 2b shows a unit cell 18 which is provided with a via 14 which is not placed in the centre of the unit cell 18, and in which a number of main elements 51 are provided which extend across the surface of the unit cell 18 in different directions from a central point which coincides with the via 14. In FIG. 2b, the main elements 51 extend in directions parallel to the first direction and substantially perpendicular thereto. Such a relatively simple pattern has the advantage that when different unit cells 18 are placed next to one another, the main elements 51 come to lie in line with one another and can readily be connected to one another. A symmetrical variant thereof is also known as an H-pattern.

Asymmetrical Contact Points

However, in contrast to what is shown in FIGS. 2a and 2b, it is also possible for the vias to indeed be positioned substantially in the centre of the unit cell 18, but for the first contact points 15 on the rear side 20 to be arranged in an asymmetrical manner with respect to the vias.

Figure 2C:
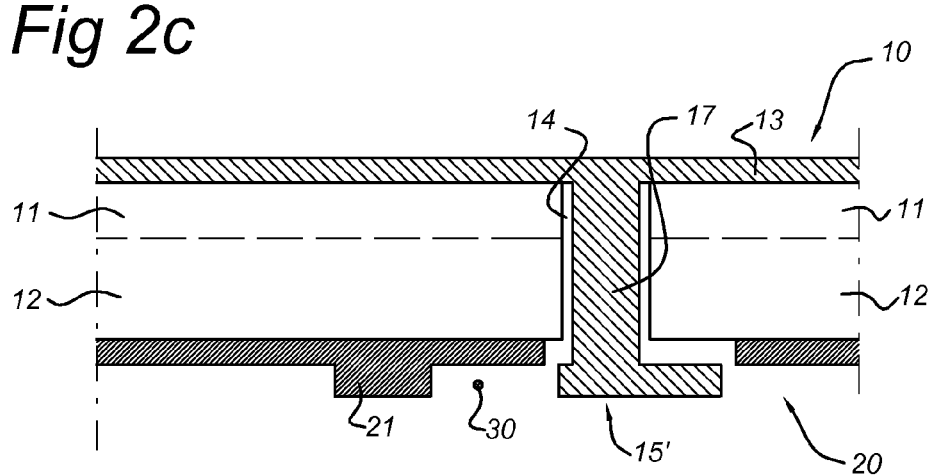

According to a further embodiment, the offset positioning of the first contact points 15' is achieved by arranging the first contact points 15' asymmetrically with respect to the via 14. An example thereof is shown in FIG. 2c, which shows a variant of FIG. 1c. Such an embodiment has the advantage that use can be made of symmetrical subpatterns which are provided with vias 14 which are situated substantially in the centre of the unit cell 18, thus reducing losses in the first pattern 13 of conductive elements 51, 52.

Figure 2D:
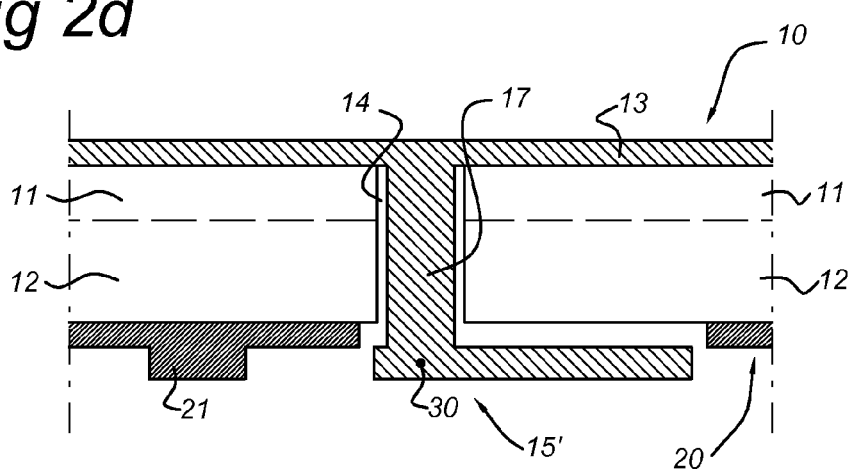

FIG. 2d shows a variant in which the via 14 is situated substantially on the contact line 30, and the offset positioning of the first contact point 15 is achieved by providing an asymmetrical first contact point 15. The ends of the first contact point 15 which are situated furthest from the contact line 30 and the second contact point 21 can be situated at substantially equal distances from the contact line 30.

The first contact points 15 may be completely or at least to their largest extent situated on a first side of the lines 30. The second contact points 21 may be completely or at least to their largest extent situated on a second side of the lines 30.

Of course, it is also possible to produce a combination of the embodiments illustrated in FIGS. 2a, 2b and FIG. 2c, in which case use is thus made of a via 14 which is not situated in the centre of the unit cell 18, and use is also made of an offset positioning of the first contact points 15'.

Unequal Unit Cells

Figure 3:
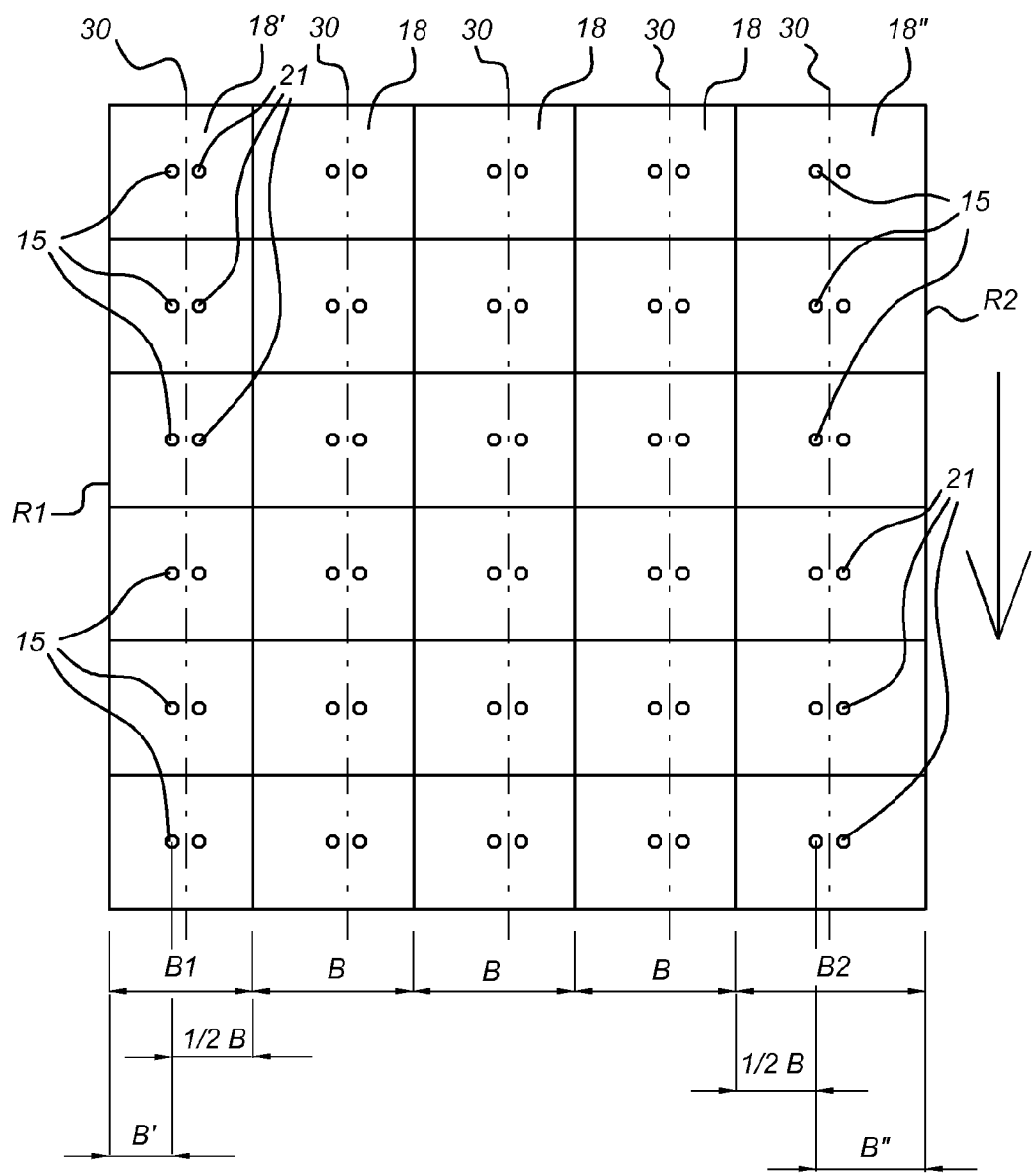

According to a further embodiment, the offset asymmetrical positioning of the first contact points 15 is achieved by a solar cell, as shown in FIG. 3, in which the first pattern of conductive elements is divided into a number of unit cells 18, 18', 18", which are placed in a matrix structure with each unit cell comprising a subpattern of conductive elements, and in which each subpattern is connected to the first contact points on the rear side by means of a via in the solar cell. The matrix structure comprises a number of rows of unit cells 18 which extend in the first direction, with a first row of unit cells 18' having a first width B1 along a first edge R1 of the solar cell in a direction substantially perpendicular to the first direction, and a second row of unit cells 18" having a second width B2 along a second edge R2 of the solar cell, with B1<B2. The first and second edges R1, R2 of the solar cell are two opposite edges, which extend substantially in the first direction.

FIG. 3 diagrammatically shows a view of the rear side 20.

The solar cell can comprise at least one further row of unit cells 18, which is positioned between the first and the second row 18', 18", in which the at least one further row of unit cells 18 has a width B, and in which B1<B<B2.

Arranging rows of a different width on the edge of the matrix structure also results in the vias 14 and thus the first contact points 15 coming to lie offset with respect to the second contact points 21.

The unit cells in the first row of unit cells 18' and the second row of unit cells 18" have a non-symmetrical subpattern, that is to say that the via 14 is not situated in the geometric centre of the unit cell. The sub-pattern can be conceived as being composed of two parts. The first part is the portion of the unit cell which is turned away from the respective edge R1, R2 and has a width B'=B/2. The second part is the portion of the unit cell which is turned towards the respective edge R1, R2 and has a width B' B/2. For the first row of unit cells 18' along the first edge R1 of the solar cell with a first width B1, the equation B'<B/2 applies. For the second row of unit cells 18" along the second edge R2 of the solar cell with a second width B2, the equation B'>B/2 applies. The vias 14 are situated on the boundary between the first and second part of the unit cells along the edges R1, R2. For the unit cells which are not situated along the edges, the via 14 is usually situated in the geometric centre of the unit cell, with the unit cell having a width B.

Thus, it is possible for the first contact points 15 on the rear side in a direction perpendicular to the first direction to in each case be situated at substantially equal distances apart.

It will be understood that a combination of the above-described variants is possible. Positioning the first contact points 15 can be achieved by using unequal unit cells, asymmetrical contact points with respect to the vias and asymmetrical subpatterns.

Assembly

As has already been discussed above, the embodiments make it possible to produce a simple assembly of solar cells, in which the solar cells are connected in series with one another by means of straight tabs. The expression straight tabs is intended to mean tabs 41 which extend substantially in one direction, without bends and the like.

Such an assembly is also referred to as a string.

The tabs 41 may be copper strips, resulting in a relatively inexpensive tab which is highly conductive. Such copper tabs can be tinned, following which they can be connected to the contact points 15, 21 by means of a soldering process. The first and second contact points 15, 21 can be made of silver in order to achieve optimum conductivity.

Another possibility is to make the tabs 41 from aluminium. Aluminium tabs 41 also result in a relatively good conductivity compared to the costs. In addition, the embodiments make it possible to use relatively large tabs, since the shadow effect does not have to be taken into account on the rear side. Larger (thicker/wider) tabs 41 result in even higher conductivity.

Aluminium tabs 41 can be connected to the first and second contact points 15, 21 by means of other connecting techniques.

One example of another connecting technique is the use of conductive adhesive, which may, for example, be used for aluminium and copper.

The tabs 41, for example made of aluminium, can, for example, have the following dimensions:
 a width of 6.5-13 mm, measured in a direction parallel to the surface of the rear side 20 perpendicular to the first direction, and
 a depth of, for example, 100-200 μm, measured in a direction perpendicular to the surface of the rear side 20.

It should be stressed again here, that the embodiments provided here make it possible to use simple, straight tabs 41 on the rear side 20 of the solar cell. Due to the fact that no shadow effect has to be taken into account, the tabs 41 can be made relatively large, which makes it possible to use less conductive, inexpensive materials, such as aluminium.

Other connecting strips 41 are also conceivable, such as tabs 41 made from strips of Cu and Al on top of one another.

The tabs 41 can be produced in an inexpensive manner, for example by rolling a wire.

FIG. 4 diagrammatically shows an assembly of solar cells as described above, in which at least two solar cells are placed next to or behind one another in the first direction, in such a manner that the contact lines substantially join one another, in which the solar cells are arranged in an alternating fashion so that the first contact points of a first solar cell are in line with the second contact points of an adjacent solar cell.

It is then readily possible to place tabs 41 which connect the first contact points of the first solar cell to the second contact points of the second solar cell. The second contact points of the second solar cell can be connected in an identical manner to first contact points of a third solar cell, etc. In other words, an assembly is provided in which contact points 15, 21 of a solar cell 1 are electrically connected to contact points 21, 15 of an adjacent solar cell by means of a straight tab 41. This may be contact points of a different kind (i.e. first contact points 15 connected to second contact points 21), or of the same kind.

In the example illustrated in FIG. 4, tabs 41 are only shown along one contact line 30. Of course, it is also possible to arrange tabs 41 along the other contact lines 30.

Thus, an arbitrary number of two or more solar cells can be placed next to one another in the first direction and be connected in series by means of tabs.

It should be noted here that it is advantageous for the tabs to be formed in a straight shape, which makes it possible to use tabs which can be produced in a simple and inexpensive manner.

FIG. 4 shows an embodiment in which contact points 15, 21 of a solar cell 1 are electrically connected to contact points 21, 15 of an adjacent solar cell 1 by means of a straight tab 41. FIG. 4 thus clearly shows the way in which a simple series connection of solar cells is made possible by means of straight tabs 41 which can be produced and placed in a simple manner.

Of course, contact points 15, 21 of solar cells which are situated at one end of such an assembly, viewed in the first direction, are only connected to contact points of an adjacent solar cell on one side, and can be connected to further processing equipment on the other side, such as a further assembly or a battery.

The contact with further processing equipment can also be formed between two adjacent solar cells somewhere in the assembly, in which case the ends of the assembly are electrically connected to one another.

A module can be formed by one or more assemblies (strings). A module can, for example, comprise 60 solar cells and is formed of 6 rows of 10 solar cells or, for example, of 10 rows of 6 solar cells.

Two rows of 10 solar cells can be electrically connected in series and can, via a bypass diode, be connected to a junction box which comprises terminals for further equipment, such as terminals for a battery or the electricity network.

Connecting two rows in series or connecting a row to the junction box is effected by means of so-called buses.

By making use of the above-described embodiments, it is possible to connect an assembly of solar cells to a further assembly of solar cells or a junction box by means of connections which are situated only on the rear side and which therefore do not take up any additional space.

In addition, this offers the advantage that for series connections of solar cells or assemblies of solar cells or (assemblies of) solar cells and peripheral equipment (such as a junction box) no connections are required which run from the front to the back. All connections can thus be arranged on the rear side.

As the tabs 41 are now situated entirely on the rear side, they can be made relatively wide, with the width being measured in a direction perpendicular to the first direction. The shadow effect of the tabs 41 does not have to be taken into account on the rear side 20. This offers the advantage that the tabs can be produced in a less expensive manner and that the electrical resistance of these tabs 41 is relatively low.

This makes it possible to use tabs 41 which are made of less expensive material, such as for example aluminium instead of copper.

The tabs 41 can, for example, have a width which is comparable to the dimensions known from the prior art. However, the tabs can now also be made wider. The maximum width is slightly less than half of the mutual distance between two adjacent contact lines 30.

Wider tabs are advantageous because these have a lower electrical resistance and are stronger from a mechanical point of view and easier to produce.

An insulating layer may be arranged between a number of tabs 41 or parts of tabs 41 and the rear side 20 of the solar cell 1.

This insulating layer may only be provided between the tabs 41 which are in contact with the first contact points 15 which are connected to the front side 10 and the rear side 20 by means of the vias 14 in order to prevent electric conduction between the tabs 41 and the rear side 20 or at least to reduce it. However, the insulating layer can also be arranged between all the tabs which are present and the rear side of the solar cell 1.

The insulating layer may be arranged directly on the rear side 20 of the solar cell or on that side of the tabs 41 which is turned towards the rear side 20 of the solar cell.

This insulation may be effected by arranging an insulating layer, for example a coating, on the rear side 20 of the solar cell 1 or on the side of the tab 41 which is turned towards the rear side 20 of the solar cell.

The insulation can also be formed as a separate layer which is provided between the solar cell and the tab 41. In this case, the insulating material can also be used to fix the conductive strips to the surface and to fill the space between the strips and the surface so that no openings/gaps are formed. To this end, the insulating material may be provided with a double-sided 'adhesive'.

The insulating layer may be made from an insulating polymer provided with an adhesive on both sides.

The insulating layer which is placed between the tab 41 and the rear side 20 may be slightly wider than the tab 41 in order to achieve optimum insulation and which slightly reduces the accuracy which is required during placement.

However, the insulating layer may also have dimensions which substantially correspond to the dimensions of the tab 41, so that contact between the tab 41 and the rear side 20 is prevented.

The assembly as illustrated in FIG. 4 has the advantage that the various solar cells 1 can be placed close together, due to the fact that the tabs 41 and the contact points 15, 21 are situated entirely on the rear side 20 of the solar cell 1. Thus, no tabs are required which connect the contact points on the front side 10 to the contact points on the rear side 20, which tabs normally run via openings between adjacent solar cells 1. Such openings were produced by placing the solar cells at a slight distance from one another. Due to the fact that this is not necessary in these embodiments, savings in terms of space and cost can be achieved.

Based on the above, those skilled in the art will understand that the term contact lines 30, as used above, does not refer to physical lines or structures with which contact can be made or along which electric conduction can take place. The term contact lines 30 is used here in the sense of lines which are arranged in a direction in which the first and second contact points 15, 21 are situated. In those instances where the term contact line(s) has been used, it is therefore also possible to use the term lines, imaginary lines, contact point lines or imaginary contact point lines.

It will be clear that the above-described embodiments have only been described by way of example and are not subject to any limitation, and that various modifications and adjustments are possible without departing from the scope of the invention and that the scope is only determined by the attached claims.

The invention claimed is:

1. A solar cell (1), comprising:
a front side (10) and a rear side (20), wherein the solar cell is configured such that when the front side (10) is turned towards incident light charge carriers accumulate on the front side (10) and charge carriers of an opposite type accumulate on the rear side (20),
in which the front side (10) is provided with a first pattern (13) of conductive elements (51, 52) which are connected to first contact points (15) on the rear side (20) by vias (14) in the solar cell,
in which the rear side (20) is provided with a second pattern of conductive elements (22) which are connected to second contact points (21) on the rear side (20),
wherein the first and second contact points (15, 21) are situated along a number of lines (30), in which the lines (30) extend substantially in a first direction along the surface of the rear side (20),
wherein a line (30) from the number of lines (30) is an imaginary line providing a reference for determining a relative arrangement of the first and second contact points (15, 21),
wherein the first contact points (15) are linearly situated on a first side of the lines (30) and the second contact points (21) are linearly situated on a second side of the lines (30),
wherein the first pattern (13) of conductive elements is divided into a plurality of unit cells (18) arranged in a matrix structure, with each unit cell (18) including a subpattern of conductive elements (51, 52) and a via (14),
wherein each subpattern is connected to a first contact point (15) on the rear side (20) by the via (14) in the unit cell, and
wherein the unit cells of the matrix structure are arranged into a plurality of rows of unit cells (18) which extend in the first direction, with a first row of unit cells (18') having a first width B1 along a first edge of the solar cell in a direction substantially perpendicular to the first direction, and a second row of unit cells (18") having a second width B2 along a second edge of the solar cell, with B1<B2.

2. The solar cell according to claim 1, in which the first and second contact points (15, 21) for each subpattern are an equal distance from a closest line (30).

3. The solar cell according to claim 1, in which a distance between each first contact point (15) and a closest line (30) and a distance between each second contact point (21) and the same closest line (30) is smaller by a factor of at least 5 than a distance between adjacent lines (30).

4. The solar cell according to claim 1, in which a distance between each first contact point (15) and a closest line (30) and a distance between each second contact point (21) and the same closest line (30) is 0-6 mm.

5. The solar cell according to claim 1, wherein when the solar cell is rotated 180 degrees within a plane defined by the solar cell, the lines extend in a second direction that is substantially parallel to the first direction.

6. The solar cell according to claim 1, wherein each via (14) is positioned offset with respect to the centre of an associated unit cell (18).

7. The solar cell according to claim 6, in which the subpattern of conductive elements (51, 52) comprises main elements (51) which extend from a central point, in which the main elements (51) form an irregular star-shaped pattern which is only rotationally symmetrical for a rotation about the central point of 360°.

8. The solar cell according to claim 1, wherein each first contact point (15) is positioned asymmetrically with respect to the associated via (14).

9. The solar cell according to claim 1, in which the subpattern is formed by conductive elements (51) which extend in the first direction and by conductive elements (51) which extend in a direction which is substantially perpendicular to the first direction.

10. The solar cell according to claim 1, in which the vias (14) and/or the corresponding first contact points (15) are in each case placed on the same side of the lines (30).

11. The solar cell according to claim 1, in which the solar cell comprises at least one further row of unit cells (18), which is positioned between the first and the second row (18', 18"), in which the at least one further row of unit cells (18) has a width B, and in which B1<B<B2.

12. An assembly of solar cells according to claim 1, in which at least two solar cells are arranged next to one another in the first direction, in such a manner that the lines (30) substantially adjoin one another, in which the solar cells are positioned in an alternating fashion, so that the first contact points (15) of a first solar cell are in line with the second contact points (21) of an adjacent solar cell.

13. The assembly of solar cells according to claim 12, in which contact points (15, 21) of a solar cell are electrically connected to contact points (21, 15) of an adjacent solar cell by means of a straight tab (41).

14. The assembly of solar cells according to claim 12, in which an insulating layer is arranged between at least some of a number of tabs (41) and the rear side (20) of the solar cell (1).

15. The solar cell according to claim 1, in which a distance between each first contact point (15) and a closest line (30) and the distance between each second contact point (21) and the same closest line (30) is at least 1-5 mm.

16. The solar cell according to claim 1, wherein the unit cells in the matrix structure are electrically connected with each other.

17. The solar cell according to claim 1, wherein the unit cells in the matrix structure are electrically isolated from each other.

* * * * *